US011112456B2

(12) United States Patent
Ke

(10) Patent No.: US 11,112,456 B2
(45) Date of Patent: Sep. 7, 2021

(54) SIGNAL SKEW MEASUREMENT METHOD, APPARATUS, MEDIUM, AND ELECTRONIC DEVICE

(71) Applicant: Changxin Memory Technologies, Inc., Anhui (CN)

(72) Inventor: Weibao Ke, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/168,104

(22) Filed: Feb. 4, 2021

(65) Prior Publication Data

US 2021/0156917 A1  May 27, 2021

Related U.S. Application Data

(63) Continuation of application No. PCT/CN2019/102107, filed on Aug. 23, 2019.

(51) Int. Cl.
*G01R 31/317* (2006.01)

(52) U.S. Cl.
CPC .............................. *G01R 31/31725* (2013.01)

(58) Field of Classification Search
CPC ........... H03D 13/003; H03D 2200/006; H03D 2200/0062; G01R 31/31725
See application file for complete search history.

(56) References Cited

U.S. PATENT DOCUMENTS 7,219,270 B1 * 5/2007 Brown ............. G01R 31/31708
360/26

7,388,937 B1 * 6/2008 Rodger ................... H04L 1/205
375/346

(Continued)

FOREIGN PATENT DOCUMENTS

CN    1581360 A    2/2005
CN    1703855 A   11/2005

(Continued)

OTHER PUBLICATIONS

PCT International Search Report and the Written Opinion dated Nov. 28, 2019, issued in related International Application No. PCT/CN2019/102107 (9 pages).

(Continued)

*Primary Examiner* — Kyle R Quigley
(74) *Attorney, Agent, or Firm* — Sheppard Mullin Richter & Hampton LLP

(57) ABSTRACT

The present invention discloses a signal skew measurement method for integrated circuit, a medium, and an electronic device. The method comprises: by a test machine, acquiring a first signal and a second signal output by an IC, respectively performing under-sampling on the first and second signals to obtain a first sampled signal and a second sampled signal; respectively performing digital conversion on the first and second sampled signals based on a preset threshold voltage to obtain a first digital signal and a second digital signal; respectively performing convolution on the first and second digital signals using a preset pulse signal to obtain a first comparison signal and a second comparison signal; and calculating a skew between the first and second comparison signals to obtain a reference skew, and determining a skew between the first and second signals according to the reference skew.

12 Claims, 11 Drawing Sheets

(56) References Cited

U.S. PATENT DOCUMENTS

| | | | |
|---|---|---|---|
| 7,437,624 | B2 | 10/2008 | Miller et al. |
| 7,627,773 | B2 | 12/2009 | Kato |
| 2005/0240365 | A1* | 10/2005 | Ho .................. H03D 13/003 702/72 |
| 2009/0234604 | A1* | 9/2009 | Hou ................ G01R 31/31725 702/69 |
| 2010/0195464 | A1* | 8/2010 | Katayama ............ G11B 7/0906 369/59.1 |
| 2014/0236533 | A1* | 8/2014 | Drachmann ............ G01F 1/662 702/176 |

FOREIGN PATENT DOCUMENTS

| | | |
|---|---|---|
| CN | 101689383 A | 3/2010 |
| CN | 101825660 A | 9/2010 |
| CN | 101833036 A | 9/2010 |
| CN | 102095936 A | 6/2011 |
| CN | 102200550 A | 9/2011 |
| CN | 102928666 A | 2/2013 |
| CN | 103095387 A | 5/2013 |
| CN | 103941087 A | 7/2014 |
| CN | 104122539 A | 10/2014 |
| CN | 109085492 A | 12/2018 |
| GB | 2321833 A | 8/1998 |

OTHER PUBLICATIONS

First Search dated Oct. 15, 2019, issued in related Chinese Application No. 201811012654.0 (2 pages).
First Office Action dated Oct. 24, 2019, issued in related Chinese Application No. 201811012654.0, with English machine translation (8 pages).
Supplemental Search dated Mar. 15, 2020, issued in related Chinese Application No. 201811012654.0 (1 page).

* cited by examiner

SIGNAL SKEW MEASUREMENT METHOD, APPARATUS, MEDIUM, AND ELECTRONIC DEVICE

CROSS-REFERENCE TO RELATED APPLICATIONS

This application is a continuation application of International Patent Application No. PCT/CN2019/102107, filed on Aug. 23, 2019, which is based on and claims priority to and benefits of Chinese Patent Application No. 201811012654.0, entitled "SIGNAL SKEW MEASUREMENT METHOD, APPARATUS, MEDIUM, AND ELECTRONIC DEVICE", filed with the State Intellectual Property Office (SIPO) of the People's Republic of China on Aug. 31, 2018. The entire content of the above-identified applications are incorporated herein by reference.

TECHNICAL FIELD

The present invention relates to the technical field of integrated circuits (ICs), and in particular, to a signal skew measurement method for ICs, an apparatus, a storage medium, and an electronic device thereof.

BACKGROUND

An IC is a microelectronic device or component. Using semiconductor manufacturing processes including oxidation, photoetching, diffusion, extension, and aluminum evaporation, it integrates various circuit elements including transistors, resistors, capacitors, and connection wires therebetween on a small silicon chip, and then bonds and encapsulates them into a chip.

With the development of the IC technology, the IC has been used in various types of electronic devices. For some electronic device, the frequency of the system clock has exceeded 100 MHz, resulting in high-speed signal transmissions and high-speed signal outputs by an IC. Due to the wiring length of a test hardware circuit and the jitters of output signals, there may be difficulty to precisely measure a phase difference or skew between IC output signals. In addition, the difficulty of sampling the high-speed signals may cause difficulty in measurement of the skew.

It is to be noted that the information disclosed in the above background is merely for enhancing the understanding of the background of the present invention, and thus may include information not constituted into prior art known to those of ordinary skill in the art.

SUMMARY

An objective of the present invention is to provide a signal skew measurement method for IC, a signal skew measurement apparatus for the IC, a storage medium and an electronic device to at least solve the problem of difficult measurement of a skew between the IC output signals.

According to one aspect of the present invention, a signal skew measurement method for an IC is provided, which includes acquiring a first signal and a second signal output by an IC, and respectively performing under-sampling on the first signal and the second signal to obtain a first sampled signal and a second sampled signal; respectively performing digital conversion on the first sampled signal and the second sampled signal based on a preset threshold voltage to obtain a first digital signal and a second digital signal; respectively performing convolution on the first digital signal and the second digital signal using a preset pulse signal to obtain a first comparison signal and a second comparison signal; and calculating a skew between the first comparison signal and the second comparison signal to obtain a reference skew, and determining a skew between the first signal and the second signal according to the reference skew.

Optionally, before performing the under-sampling, the signal skew measurement method further includes respectively performing delay calibration on the first signal and the second signal.

Optionally, the respectively performing delay calibration on the first signal and the second signal includes respectively performing the delay calibration on the first signal and the second signal using a time domain reflectometry (TDR).

Optionally, the respectively performing under-sampling on the first signal and the second signal includes: determining an under-sampling period according to a period of the first signal, a period of the second signal, and an effective sampling period; and respectively performing the under-sampling on the first signal and the second signal based on the under-sampling period.

Optionally, the respectively performing digital conversion on the first sampled signal and the second sampled signal based on a preset threshold voltage includes: respectively setting sections of the first sampled signal and the second sampled signal higher than the preset threshold voltage as 1, and respectively setting sections of the first sampled signal and the second sampled signal lower than the preset threshold voltage as 0; or respectively setting sections of the first sampled signal and the second sampled signal higher than the preset threshold voltage as 0, and respectively setting sections of the first sampled signal and the second sampled signal lower than the preset threshold voltage as 1.

Optionally, the calculating a skew between the first comparison signal and the second comparison signal to obtain a reference skew comprises: determining a plurality of calculation sampling points of each of the first comparison signal and the second comparison signal; and calculating an average of time intervals between the plurality of calculation sampling points of the first comparison signals and the plurality of calculation sampling points of the second comparison signal, and assigning the average of the time intervals to the reference skew.

Optionally, the determining the skew between the first signal and the second signal according to the reference skew includes: calculating a product of the reference skew and the effective sampling period; and assigning the product of the reference skew and the effective sampling period to the skew between the first signal and the second signal.

Optionally, the preset threshold voltage is a half of an amplitude of the first sampled signal and the second sampled signal.

Optionally, the preset pulse signal is a pulse signal corresponding to a ½-bit theoretical time width.

Optionally, the respectively performing delay calibration on the first signal and the second signal comprises: compensating a delay of the first signal or the second signal by adjusting a time of a rising/falling edge of the first signal or the second signal according to a determined delay.

Optionally, the under-sampling period is greater than a minimum sampling period of a test machine for testing the IC.

Optionally, the determining the under-sampling period is in accordance with a sampling parameter.

Optionally, the plurality of calculation sampling points include a plurality of middle points of rising/falling edges of each of the first comparison signal and the second comparison signal.

Optionally, the first signal or the second signal includes a clock.

Optionally, the signal skew measurement method further includes compensating signals output from the IC according to the skew and testing the IC using a semiconductor test machine.

According to one aspect of the present invention, there is provided a computer readable storage medium configured to be used by a semiconductor test machine, which stores a computer program thereon. And when executed by a processor, the computer program implements the above signal skew measurement method.

According to one aspect of the present invention, there is provided a signal skew measurement apparatus, including: a processor and a memory, which is configured to store an executable instruction of the processor. The processor is configured to execute the above signal skew measurement method by executing the executable instruction.

According to one aspect of the present invention, a signal skew measurement apparatus, applicable to an integrated circuit (IC), is provided. The apparatus includes an under-sampling module, a digital conversion module, a convolution module, and a skew measurement module.

The under-sampling module may be configured to acquire a first signal and a second signal output by the IC, and respectively perform under-sampling on the first signal and the second signal to obtain a first sampled signal and a second sampled signal.

The digital conversion module may be configured to respectively perform digital conversion on the first sampled signal and the second sampled signal based on a preset threshold voltage to obtain a first digital signal and a second digital signal.

The convolution module may be configured to respectively perform convolution on the first digital signal and the second digital signal using a preset pulse signal to obtain a first comparison signal and a second comparison signal.

The skew measurement module may be configured to calculate a skew between the first comparison signal and the second comparison signal to obtain a reference skew, calculate a product of the reference skew and an effective sampling period, and assign the product to the skew between the first signal and the second signal.

Optionally, the apparatus may further include: a delay calibration module, configured to perform delay calibration on the first signal and the second signal, respectively.

According to one aspect of the present invention, a non-transitory computer-readable storage medium is provided. The medium may store computer programs executable by a process. Upon being executed by the processor, the computer programs may cause the processor to perform any one of the aforementioned signal skew measurement methods.

According to one aspect of the present invention, an electronic device is provided. The electronic device may include a processor and computer-readable storage medium storing computer programs executable by the processor. Upon being executed by the processor, the computer programs may cause the processor to perform any one of the aforementioned signal skew measurement methods.

In the technical solutions provided by some embodiments of the present invention, by respectively performing the under-sampling, digital conversion, and convolution on the first signal and the second signal output by the IC, and at last by calculating the skew between the two signals after the convolution to determine the skew between the first signal and the second signal, the skew between the IC output signals may be accurately measured using the method of the present invention on one hand. On the other hand, with the under-sampling, the problem of difficult sampling of high-speed signals may be solved. And furthermore, with the convolution, the impact of the signal jitter to measurement of the skew may be eliminated.

It is to be understood that both the summary and the detailed description are exemplary and explanatory only and are not necessarily restrictive to the present invention.

BRIEF DESCRIPTION OF DRAWINGS

The accompanying drawings, which are incorporated in and constitute a part of the specification, illustrate embodiments of the present invention and together with the specification, serve to explain the principles of the present invention. Apparently, the accompanying drawings in the following description are only some embodiments of the present invention, and those of ordinary skill in the art can derive other drawings from the accompanying drawings without creative efforts. In the drawings.

DETAILED DESCRIPTION

The embodiments of the present invention will be described comprehensively in conjunction with the accompanying drawings. However, the embodiments of the present invention can be implemented in various forms, and should not be considered as being limited to the embodiments described herein. Instead, these embodiments are provided to make the present invention thorough and completed, and fully convey the concepts of the embodiments to those skilled in the art. The described characteristics, structures, or properties may be combined in one or more embodiment in any appropriate manner. In the following description, many particular details are provided to give a full understanding on the embodiments of the present invention. However, it would be appreciated by those skilled in the art that one or more of the particular details may be omitted by the implementation of the technical solutions of the present invention, or other methods, components, apparatuses, steps and the like may be adapted. In other cases, the known technical solutions are not illustrated or described in detail to prevent distracting and making aspects of the present invention obscure.

Additionally, the accompanying drawings are merely schematic diagrams illustrating the present invention and are unnecessarily drawn to scale. In the accompanying drawings, identical reference signs represent identical or similar parts, and therefore, the descriptions thereof may not be repeated. Some block diagrams in the accompanying drawings are functional entities, which do not necessarily correspond to physically or logically independent entities. These functional entities may be implemented in a software form, implemented in one or more hardware modules or integrated circuits, or in different networks and/or processor apparatuses and/or microcontroller apparatuses.

The flowcharts in the accompanying drawings are merely exemplary descriptions and may not include all steps. For example, some steps may be further broken down, and some steps may be incorporated or partially incorporated, so that sequences executed actually may be various according to actual conditions.

At present, on one hand, a special measurement device adopted by some technologies to measure the high-speed signals may not be suitable for a mass production test. On the other hand, a mass production test device adopted by some technologies to measure the high-speed signals is often directed at a system on chip (SoC) and a radio-frequency test machine and always has limitations and costs more.

For high-speed signals output by the IC, due to reasons such as the impact of wiring of a test hardware circuit and the jitters of signals, a skew between the signals cannot be accurately measured. The high-speed signals output by the IC have the jitters, resulting in that rising/falling edges of the signals cannot be determined.

Figure 1:
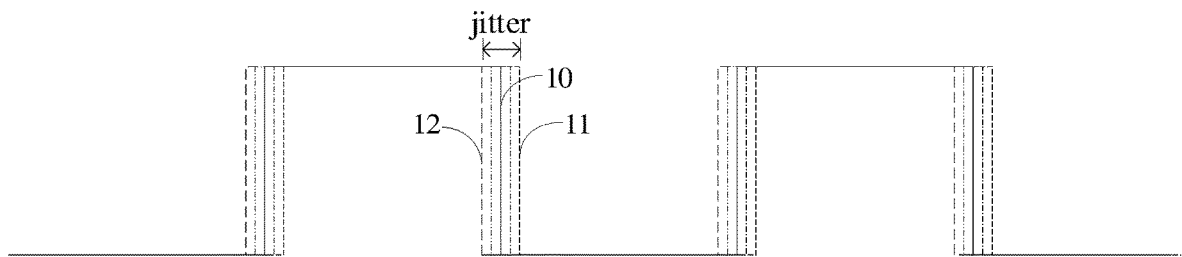
FIG. 1 illustrates a schematic diagram of a condition in which a signal output by an IC has jitters according to an embodiment of the present invention.

FIG. 1 illustrates a schematic diagram of a condition in which a signal has jitters. Referring to FIG. 1, the normal signal is shown as a signal 10. However, due to the impact of a noise (e.g., thermal noise, shot noise, flicker noise, or burst noise), the signal 10 may have jitters, and may become, for example, a signal 11 or a signal 12 shown in the figure, which may be undesirable to subsequent processing units for processing the signals.

The IC output signals in the embodiments of the present invention may include a clock output by the IC. However, it should be understood that the skew measurement method for the signals provided by the embodiments of the present invention may further be applied to a scenario of other signals besides the clock.

Figure 2:
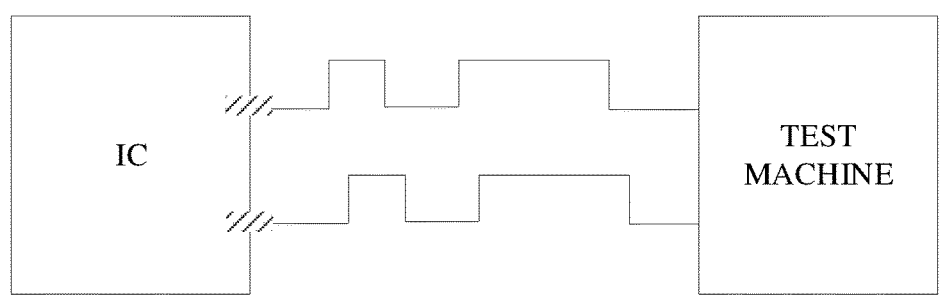
FIG. 2 illustrates a schematic diagram of an application scenario for determining a skew according to an embodiment of the present invention.

An application scenario according to an embodiment of the present invention may be shown in FIG. 2. Two signals generated by an IC chip may be transmitted to a test machine (e.g., a tester) via a transmission medium. The test machine may be provided with a processing unit and a storage unit, and may calculate a skew between the two signals. That is, the signal skew measurement method provided by the embodiments of the present invention may be implemented by the test machine.

Figure 3:
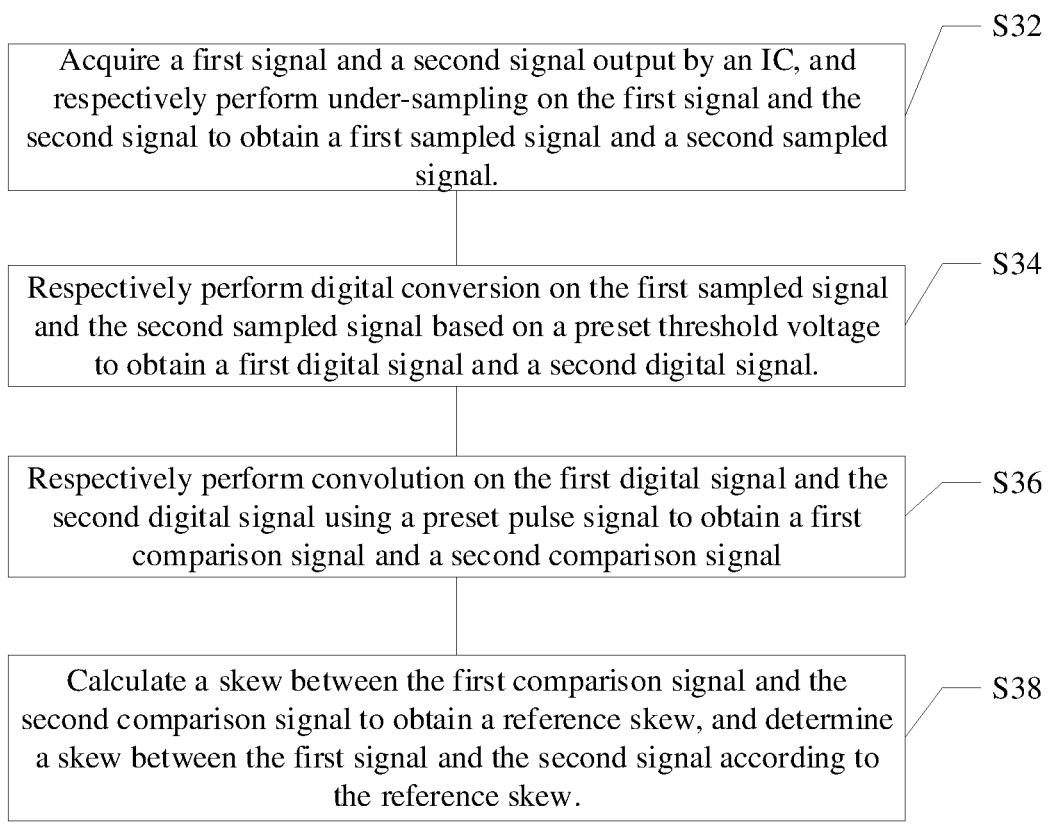
FIG. 3 illustrates a flowchart of a signal skew measurement method for IC according to an embodiment of the present invention.

FIG. 3 illustrates a flowchart of a signal skew measurement method for IC according to an embodiment of the present invention. Referring to FIG. 3, the signal skew measurement method according to the embodiment of the present invention may include the following steps.

At S32, acquire a first signal and a second signal output by an IC, and respectively perform under-sampling on the first signal and the second signal to obtain a first sampled signal and a second sampled signal.

First, the test machine may acquire the first signal and the second signal output by the IC. Terms such as "first" and "second" used herein are merely for distinguishing the signals, and should not construe limits to the present invention. In addition, the present invention does not limit the processes for generating the first signal and the second signal, and the waveform, the period, and the amplitude of each signal.

Then, the under-sampling may be performed on the first signal and the second signal, respectively. Specifically, an under-sampling period may be determined according to a period of the first signal, a period of the second signal, and an effective sampling period. For example, the under-sampling period $T_s$ may be determined using the following formula 1:

$$T_s = kT_i \pm \Delta t \quad (1)$$

where the $T_i$ is a period of an original signal (e.g., the first signal or the second signal), the $\Delta t$ is an effective sampling period, and the k is a sampling parameter of a positive integer. In addition, the determined under-sampling period $T_s$ may be greater than the minimum sampling period of the test machine.

For example, the period $T_i$ of the original signal is 100 ps. If the maximum sampling frequency of the test machine is 100 MHz (i.e., the minimum sampling period is 10000 ps), the k may be set as 200 and the effective sampling period $\Delta t$ may be set as 1 ps.

Figure 4:
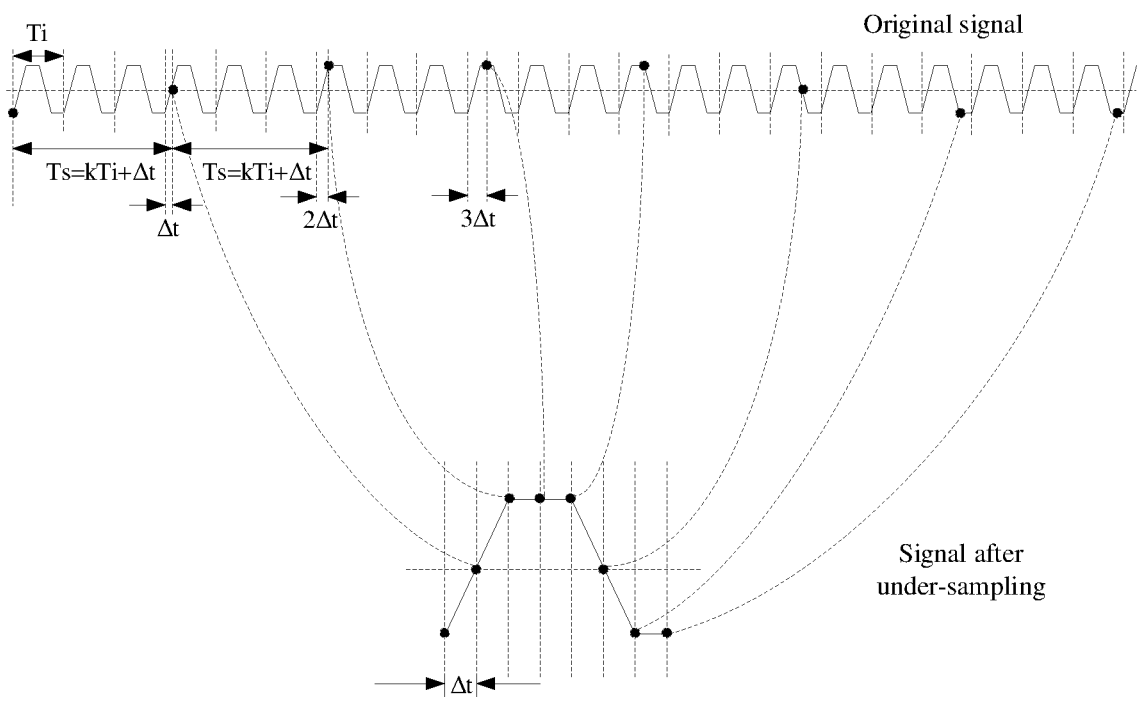
FIG. 4 illustrates a schematic diagram of an under-sampling process according to an embodiment of the present invention.

Upon the determination of the under-sampling period, the under-sampling may be respectively performed on the first signal and the second signal. FIG. 4 schematically illustrates an under-sampling process. Referring to FIG. 4, the under-sampling is performed every under-sampling period $T_s$ on the original signals, and the under-sampled signals are generated by connecting sampled phase points. The first signal is subject to the under-sampling to obtain the first sampled signal, and the second signal is subject to the under-sampling to obtain the second sampled signal.

The under-sampling manner may be used to effectively solve the problems of difficult sampling of signals caused by the high frequency of the high-speed signals output by the IC.

At S34, respectively perform digital conversion on the first sampled signal and the second sampled signal based on a preset threshold voltage to obtain a first digital signal and a second digital signal.

Figure 5:
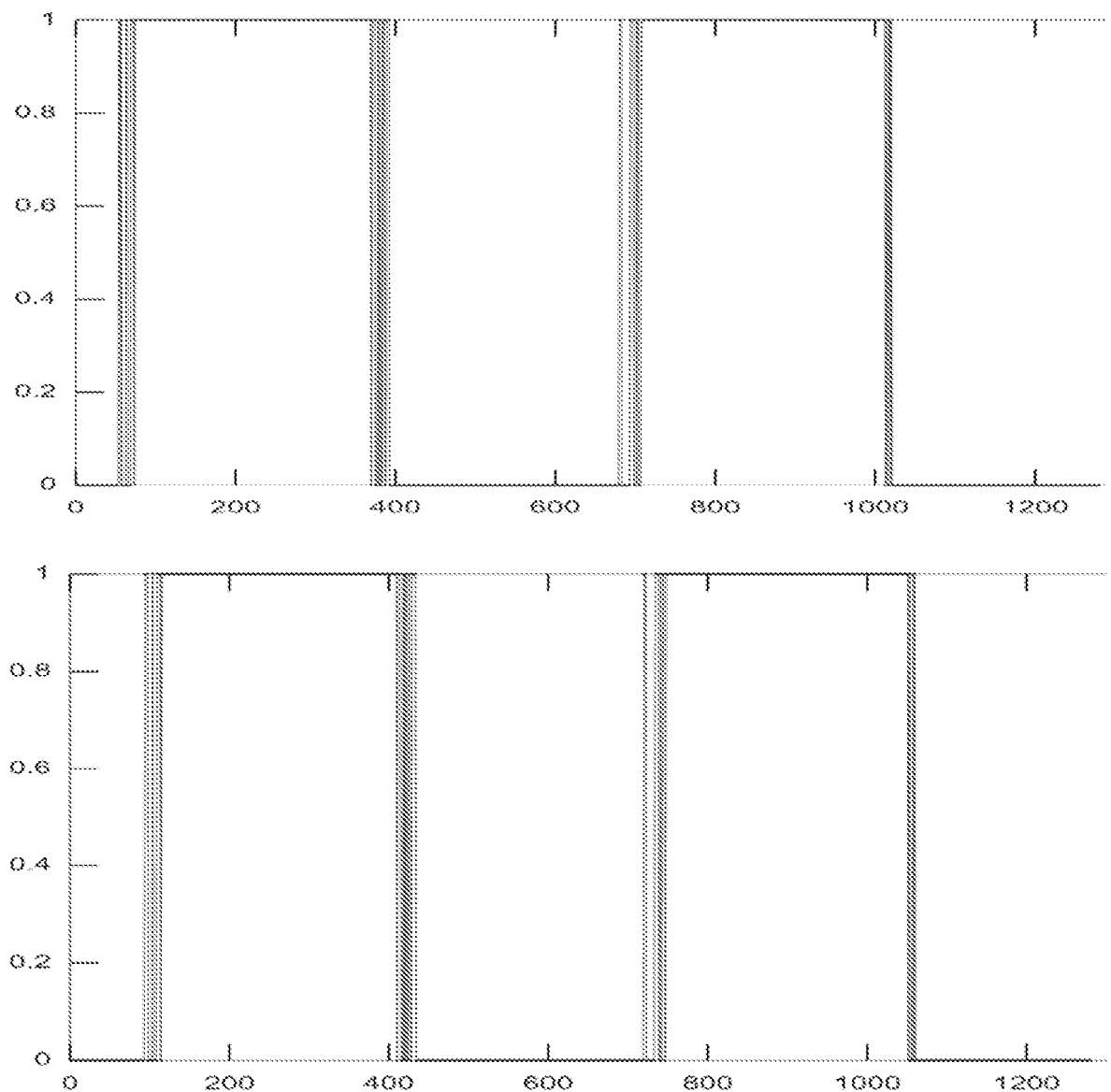
FIG. 5 illustrates a schematic diagram of a signal after digital conversion according to an embodiment of the present invention.

Upon the determination of the first sampled signal and the second sampled signal, the digital conversion may be respectively performed on the first sampled signal and the second sampled signal based on the preset threshold voltage to obtain the first digital signal and the second digital signal. The first sampled signal and the second sampled signal may be shown in FIG. 5.

Specifically, in some embodiments of the present invention, sections of the first sampled signal and the second sampled signal higher than the preset threshold voltage may be respectively set as 1, and sections of the first sampled signal and the second sampled signal lower than the preset threshold voltage may be respectively set as 0. In other embodiments of the present invention, the sections of the first sampled signal and the second sampled signal higher than the preset threshold voltage may be respectively set as 0, and the sections of the first sampled signal and the second sampled signal lower than the preset threshold voltage may be respectively set as 1.

In addition, the preset threshold voltage may be determined based on the sampled signals determined in the step S32. For example, the preset threshold voltage may be set as ½ of an amplitude of each of the sampled signals. That is, if the amplitude of the first sampled signal and the second sampled signal is 1.2 V, the preset threshold voltage may be set as 0.6 V. In such a case, the sections of the sampled signals greater than 0.6 V are converted into 1, and the sections of the sampled signals less than 0.6 V are converted into 0.

At S36, respectively perform convolution on the first digital signal and the second digital signal using a preset pulse signal to obtain a first comparison signal and a second comparison signal.

In this embodiment of the present invention, the preset pulse signal may be a pulse signal corresponding to a ½-bit theoretical time width. However, solutions for determining the comparison signals using other pulse signals pertain to the concept of the present invention as well.

If each digital signal determined in the step S34 is recorded as $f_1(t)$, and the preset pulse signal is recorded as $f_2(t)$, the convolution may be performed using the following formula 2:

$$f_1(t)*f_2(t)=\int_{-\infty}^{+\infty}f_1(\tau)f_2(t-\tau)d\tau \quad (2)$$

Figure 6:
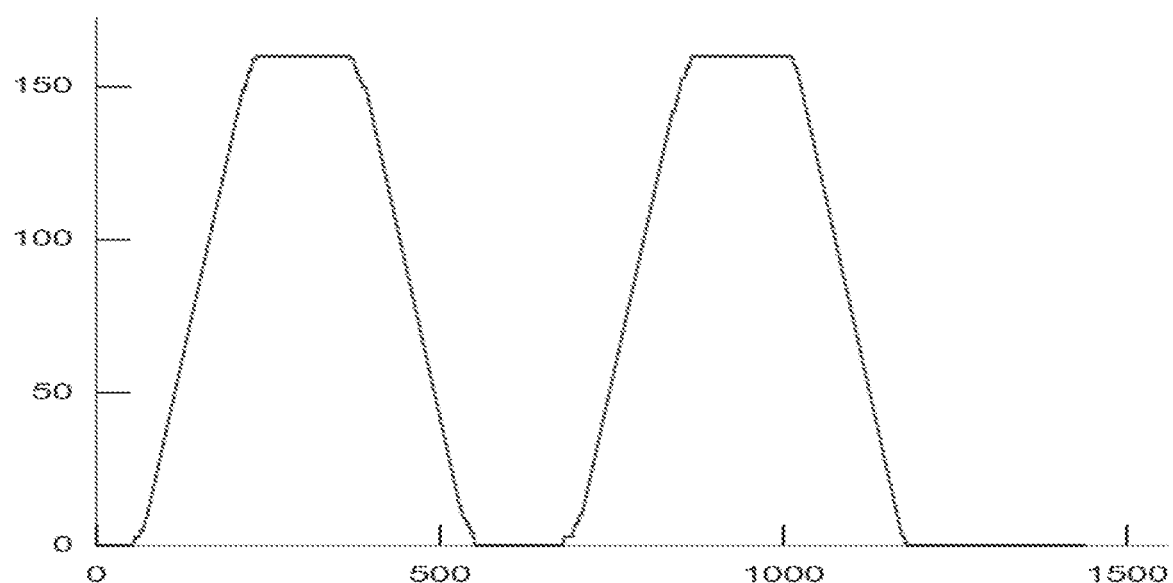
FIG. 6 illustrates a schematic diagram of a signal after convolution according to an embodiment of the present invention.

Referring to FIG. 6, an oscillogram of a signal after the convolution with the preset pulse signal, such as a ½-bit theoretical time width, is illustrated.

Through the step S34 and the step S36, the impact of the jitters to the signals may be eliminated.

At S38, calculate a skew between the first comparison signal and the second comparison signal to obtain a reference skew, and determine a skew between the first signal and the second signal according to the reference skew.

First, a plurality of points (e.g., middle points) of the rising/falling edge of the first comparison signal and the second comparison signal may be determined. Then, an average of time intervals between the rising/falling edge middle points of the first comparison signal and the rising/falling edge middle points of the second comparison signal is calculated, and the determined average of time intervals is assigned to the' reference skew.

Figure 7:
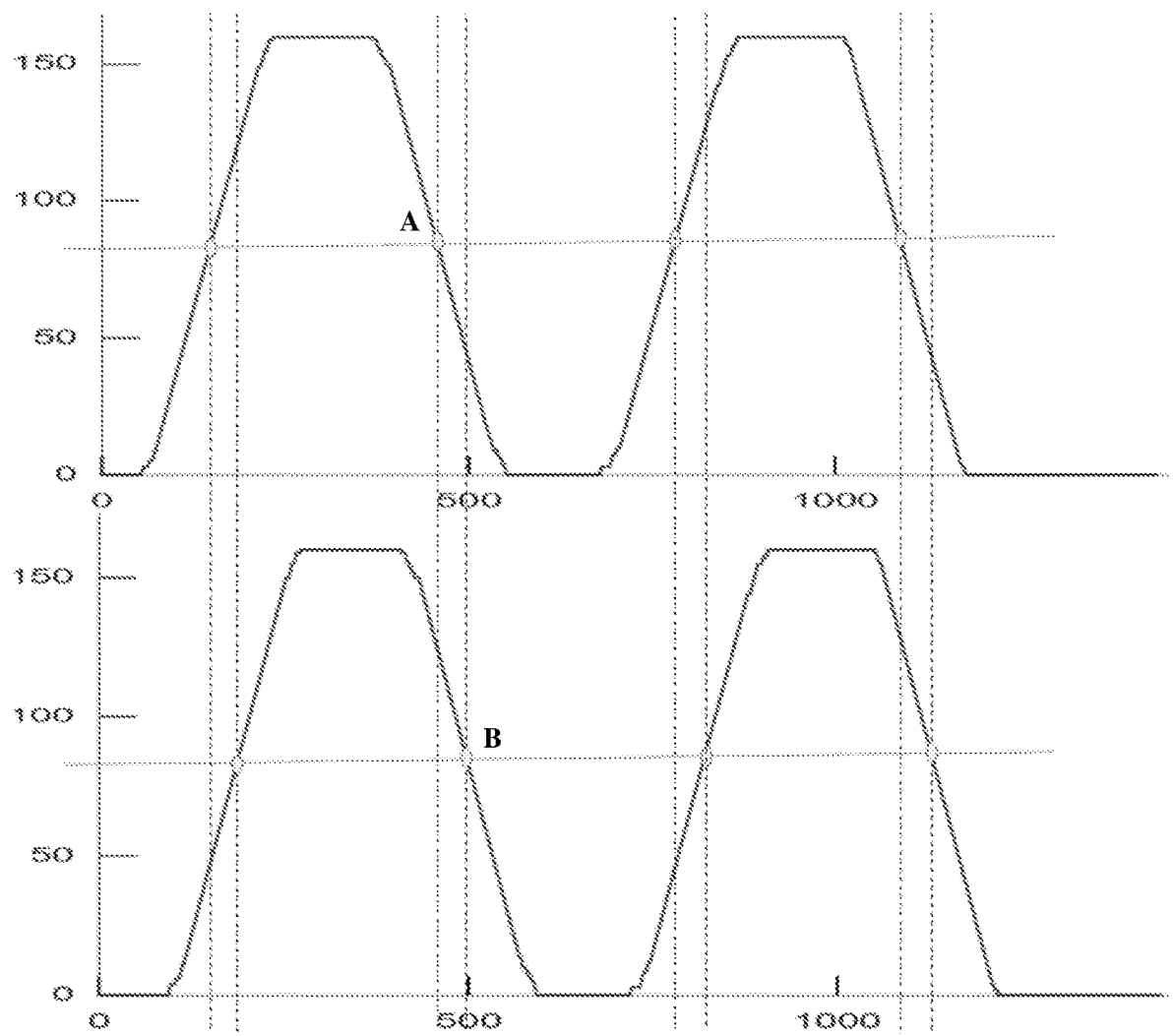
FIG. 7 schematically illustrates a comparison of a first comparison signal and a second comparison signal according to an embodiment of the present invention.

FIG. 7 schematically illustrates a comparison of a first comparison signal and a second comparison signal according to an embodiment of the present invention. First, points on the rising/falling edge of the first comparison signal, such as middle points A in the figure, may be determined, and points on the rising/falling edge of the second comparison signal, such as middle points B in the figure, may be determined. The time intervals between the points A and the points B may be calculated. The points A and the points B may be considered as sampling points for reference skew calculation, and a predetermined number of sampling points may be respectively selected from the first comparison signal and the second comparison signal, e.g., the predetermined number may be 250. Time interval corresponding to each sampling point is calculated, and accordingly, the average of the calculated time intervals is determined as the reference skew.

Upon the determination of the reference skew, the skew between the first signal and the second signal may be determined according to the reference skew. Specifically, a product of the reference skew and the effective sampling period $\Delta t$ may be calculated, and be determined as the skew between the first signal and the second signal.

According to some embodiments of the present invention, in view of a test error caused by the wiring delay of the test hardware circuit, e.g., 1 ns of delay every 6 inches, the present invention further provides a delay calibration solution.

Before the under-sampling is performed on the first signal and the second signal, the method provided by the present invention may further include a step of respectively performing delay calibration on the first signal and the second signal. For example, the delay calibration may be respectively performed on the first signal and the second signal using a TDR.

Specifically, first, the test machine may send a pulse signal or a step signal to a transmission path that is configured for acquiring the first signal or the second signal. As the test machine is not connected to an IC chip in the TDR, i.e., the chip is in an open-circuit state, the sent signal is reflected completely. Then, the test machine may measure a time difference from a transmitting wave to a reflected wave and then to a transmitting point, so that the delay of the first signal or the second signal due to the testing hardware may be determined. Then, the test machine may adjust timing of the comparison edge according to the determined delay to compensate the signals.

In addition, once the signal skew has been determined, the signals output from the IC may be compensated accordingly, and the IC can be more accurately tested by a semiconductor test machine. As way of example, if it is determined that the first signal is 0.6 ns ahead of the second signal, a delay calibration of 0.6 ns may be performed on the first signal so that the semiconductor test machine can test the first signal and the second signal in the same phase, which may improvement the accuracy of the testing.

To summarize, according to the signal skew measurement method provided by this embodiment of the present invention, on one hand, the skew between the IC output signals may be accurately measured using the method of the embodiments of the present invention. On the other hand, with the under-sampling, the problem of difficult sampling of the high-speed signals may be solved. Furthermore, the convolution may eliminate the impact of the signal jitters to the measurement of the skew.

It is to be noted that although each step of the method in the present invention is described in particular sequences in the accompanying drawings, it does not require or imply that these steps are to be executed according to the particular sequences or all steps are to be executed to achieve the desired results. Additionally or alternatively, some steps may be omitted, multiple steps may be combined into one step for execution, and/or one step may be divided into multiple steps for execution, etc.

Further, an embodiment of the present invention provides a signal skew measurement apparatus for an IC.

Figure 8:
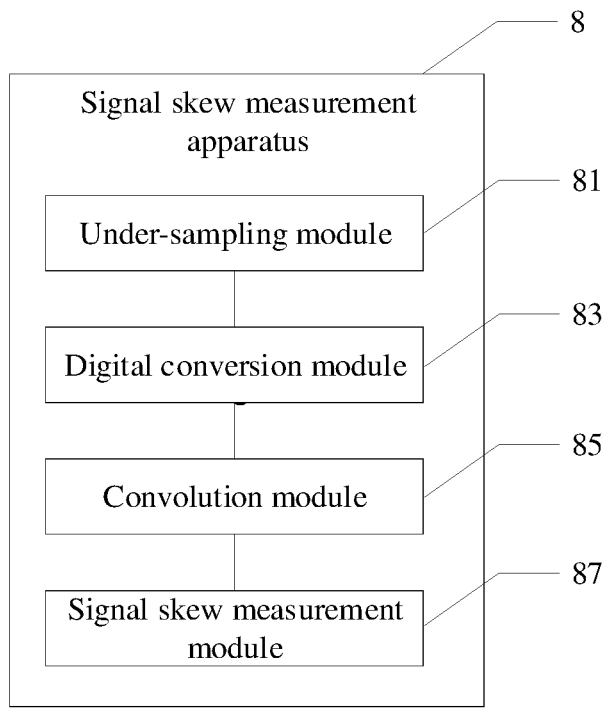
FIG. 8 schematically illustrates a block diagram of a signal skew measurement apparatus for IC according to an embodiment of the present invention.

FIG. 8 schematically illustrates a block diagram of a signal skew measurement apparatus 8 according to an embodiment of the present invention. Referring to FIG. 8, the signal skew measurement apparatus according to this embodiment of the present invention may include an under-sampling module 81, a digital conversion module 83, a convolution module 85, and a skew measurement module 87.

Specifically, the under-sampling module 81 may be configured to acquire a first signal and a second signal output by an IC, and respectively perform under-sampling on the first signal and the second signal to obtain a first sampled signal and a second sampled signal. The digital conversion module 83 may be configured to respectively perform digital conversion on the first sampled signal and the second sampled signal based on a preset threshold voltage to obtain a first digital signal and a second digital signal. The convolution module 85 is configured to respectively perform convolution on the first digital signal and the second digital signal using a preset pulse signal to obtain a first comparison signal and a second comparison signal. The skew measurement module 87 may be configured to calculate a skew between the first comparison signal and the second comparison signal as a reference skew, and determine a skew between the first signal and the second signal according to the reference skew.

According to the signal skew measurement apparatus provided by this embodiment of the present invention, on one hand, the skew between the IC output signals may be accurately measured using the method of the present invention. On the other hand, the under-sampling may solve the problem of difficult sampling of the high-speed signals. Furthermore, the convolution may eliminate the impact of the signal jitters to the measurement of the skew.

Figure 9:
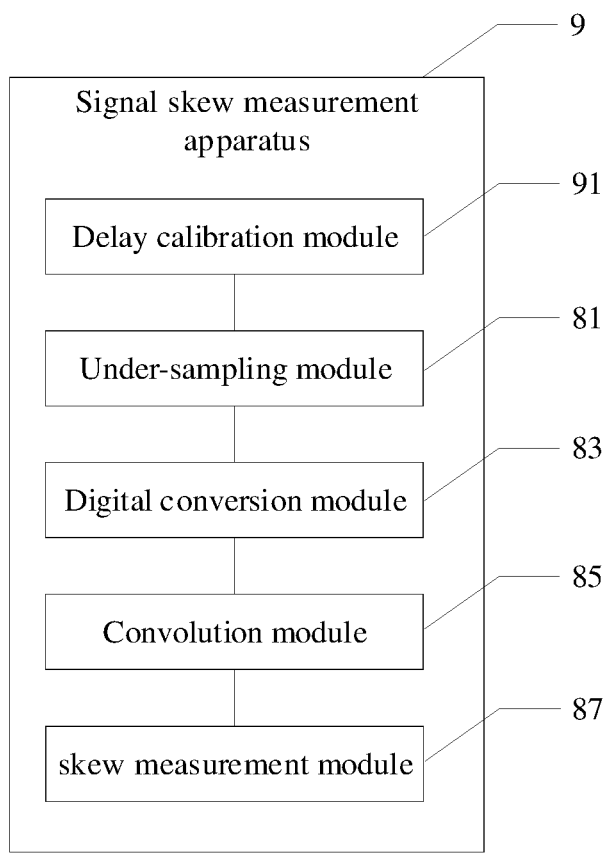
FIG. 9 schematically illustrates a block diagram of a signal skew measurement apparatus for IC according to another embodiment of the present invention.

According to an embodiment of the present invention shown in FIG. 9, the signal skew measurement apparatus 9 may further include a delay calibration module 91, besides the under-sampling module 81, the digital conversion module 83, the convolution module 85, and the skew measurement module 87 of the signal skew measurement apparatus 8.

Specifically, the delay calibration module 91 may be configured to respectively perform delay calibration on the first signal and the second signal.

Figure 10:
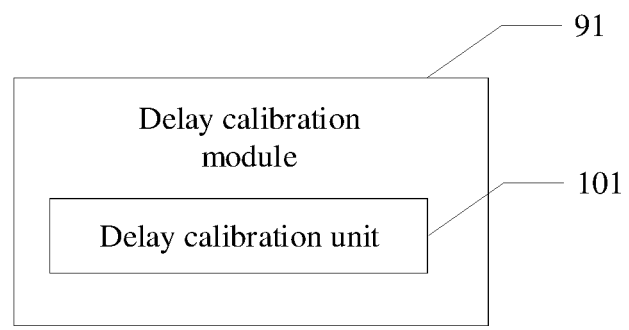
FIG. 10 schematically illustrates a block diagram of a delay calibration module according to an embodiment of the present invention.

According to this embodiment of the present invention shown in FIG. 10, the delay calibration module 91 may include a delay calibration unit 101.

Specifically, the delay calibration unit 101 may be configured to respectively perform the delay calibration on the first signal and the second signal using a specific manner, e.g., TDR.

In the embodiment of the present invention for performing the delay calibration on the signals, the delay calibration may eliminate the test error caused by the test hardware circuit, such as the wiring delay of the test hardware circuit.

Figure 11:
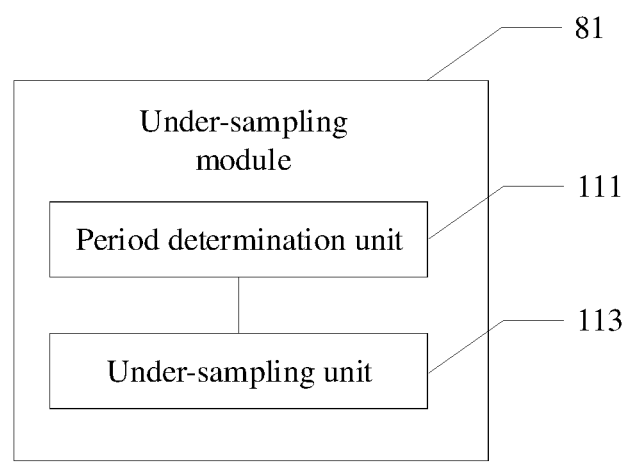
FIG. 11 schematically illustrates a block diagram of an under-sampling module according to an embodiment of the present invention.

According to this embodiment of the present invention shown in FIG. 11, the under-sampling module 81 may include a period determination unit 111 and an under-sampling unit 113.

Specifically, the period determination unit 111 may be configured to determine an under-sampling period according to a period of the first signal, a period of the second signal, and an effective sampling period. The under-sampling unit 113 may be configured to respectively perform the under-sampling on the first signal and the second signal based on the under-sampling period.

Figure 12:
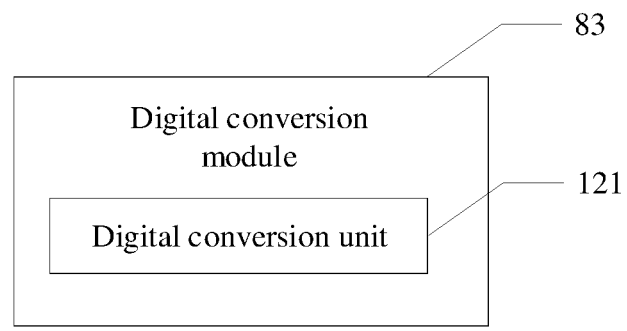
FIG. 12 schematically illustrates a block diagram of a digital conversion module according to an embodiment of the present invention.

According to an embodiment of the present invention shown in FIG. 12, the digital conversion module 83 may include a digital conversion unit 121.

Specifically, the digital conversion unit 121 may be configured to respectively set sections of the first sampled signal and the second sampled signal higher than the preset threshold voltage as 1, and respectively set sections of the first sampled signal and the second sampled signal lower than the preset threshold voltage as 0. Or the digital conversion unit may be configured to respectively set sections of the first sampled signal and the second sampled signal higher than the preset threshold voltage as 0, and respectively set sections of the first sampled signal and the second sampled signal lower than the preset threshold voltage as 1.

Figure 13:
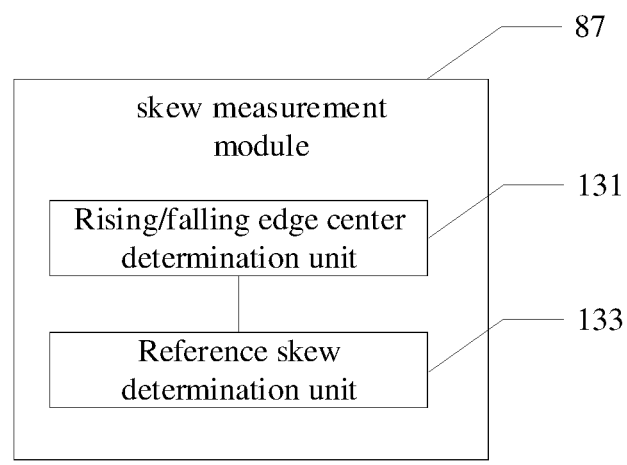
FIG. 13 schematically illustrates a block diagram of a skew measurement module according to an embodiment of the present invention.

According to an embodiment of the present invention shown in FIG. 13, the skew measurement module 87 may include a rising/falling edge center determination unit 131 and a reference skew measurement unit 133.

Specifically, the rising/falling edge center determination unit 131 may be configured to determine a plurality of rising/falling edge middle points for each of the first comparison signal and the second comparison signal. The reference skew measurement unit 133 may be configured to calculate an average of time intervals between the rising/falling edge middle points of the first comparison signal and the rising/falling edge middle points of the second comparison signal, and assign the average of time intervals to the reference skew.

Figure 14:
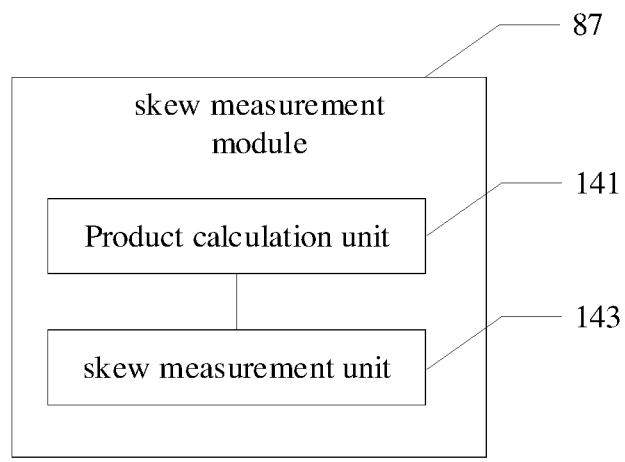
FIG. 14 schematically illustrates a block diagram of a skew measurement module according to another embodiment of the present invention.

According to an embodiment of the present invention shown in FIG. 14, the skew measurement module 87 may include a product calculation unit 141 and a skew measurement unit 143.

Specifically, the product calculation unit 141 may be configured to calculate a product of the reference skew and the effective sampling period. The skew measurement unit 143 may be configured to assign the product of the reference skew and the effective sampling period as the skew between the first signal and the second signal.

It should be understood that, in some embodiments of the present invention, the rising/falling edge center determination unit 131, the reference skew measurement unit 133, the product calculation unit 141, and the skew measurement unit 143 may all be included in the skew measurement module 87.

According to an embodiment of the present invention, the preset threshold voltage may be a half of an amplitude of each of the first sampled signal and the second sampled signal.

According to an embodiment of the present invention, the preset pulse signal may be a pulse signal corresponding to a ½-bit theoretical time width.

The functionality of each module of the signal skew measurement apparatus in the embodiment of the present invention is the same as that described in the embodiments of the method, and will not be repeated herein.

In an embodiment of the present invention, a computer readable storage medium is further provided. The readable storage medium stores a program product capable of implementing the method described in the specification. In some embodiments, each aspect of the present invention may further be implemented in a form of a program product. The program product may include at least a program code, and when the program product is executed on a terminal device, the program code is configured to cause the terminal device to execute the steps in the methods described in embodiments of the present invention.

Figure 15:
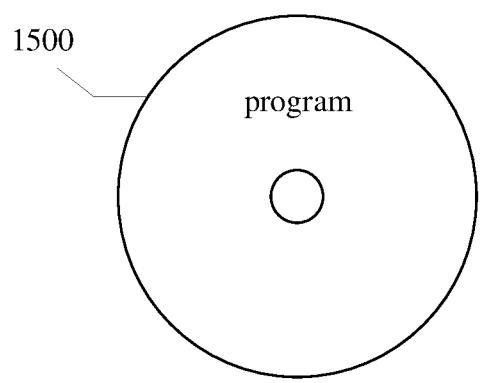
FIG. 15 illustrates a schematic diagram of a storage medium according to an embodiment of the present invention.

Referring to FIG. 15, a program product 1500 configured for implementing the above described method according to an embodiment of the present invention is depicted. The program product may include a portable compact disc read-only memory (CD-ROM), and include at least a program code. The program product may be executed on a terminal device such as a personal computer. However, the program product in embodiments of the present invention is not limited to this. In the embodiments of the present invention, the readable storage medium may be any tangible medium that may include or store a program, and the program may be used by or in combined with an instruction execution system, apparatus, or device.

Any combination of one or more readable medium may be included in the program product. The readable medium may be a readable signal medium or a readable storage medium. The readable storage medium may be, for example, but not limited to, an electronic, magnetic, optical, electromagnetic, infrared, or semiconductor system, apparatus, device, or any combination thereof. The readable storage medium would include an electrical connection having one or more wires, a portable diskette, a hard disk, a random-access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination thereof.

The computer readable signal medium may include a propagated data signal carrying readable program codes in a baseband or as a part of a carrying wave. Such a propagated data signal may be in a variety of forms, including but not limited to an electromagnetic signal, an optical signal, or any suitable combination thereof. The readable signal medium may include any readable medium that is not a readable storage medium, and may send, propagate, or transmit a program that is used by or in combined with an instruction execution system, apparatus, or device.

The program codes embedded in a readable medium may be transmitted using any appropriate medium, including but not limited to wireless, wired, optical fiber cable, RF, and the like, or any suitable combination thereof.

The program codes for executing operations of the present invention may be written in any combination of one or more programming languages, including object-oriented programming languages such as Java, C++, or the like, and conventional procedural programming languages such as the "C" language or similar programming languages. The program codes may be executed entirely on a user's computing device, executed partially on a user device, executed as a stand-alone software package, executed partially on the user's computing device and partially on a remote computing device, or executed entirely on the remote computing device or a server. When executing on the remote computing device, the remote computing device may be connected to an external computing device through any types of network including a local area network (LAN) or a wide area network (WAN), or may be connected to an external computing device (for example, through an Internet using an Internet service provider).

In an embodiment of the present invention, an electronic device capable of implementing the above method is further provided.

To those skilled in the art, aspects of the present invention may be implemented as a system, a method, or a program product. Accordingly, the aspects of the present invention may be in a form of a hardware embodiment, a software embodiment (including firmware, micro-code, etc.), or an embodiment combining software and hardware aspects. Those embodiments may all generally be referred to herein as a "circuit," "module," or "system."

The electronic device 1600 according to an embodiment of the present invention will be described with reference to FIG. 16. The electronic device 1600 in FIG. 16 is merely an example, and should not construe any limit to the functions and applications of the embodiments of the present invention.

Figure 16:
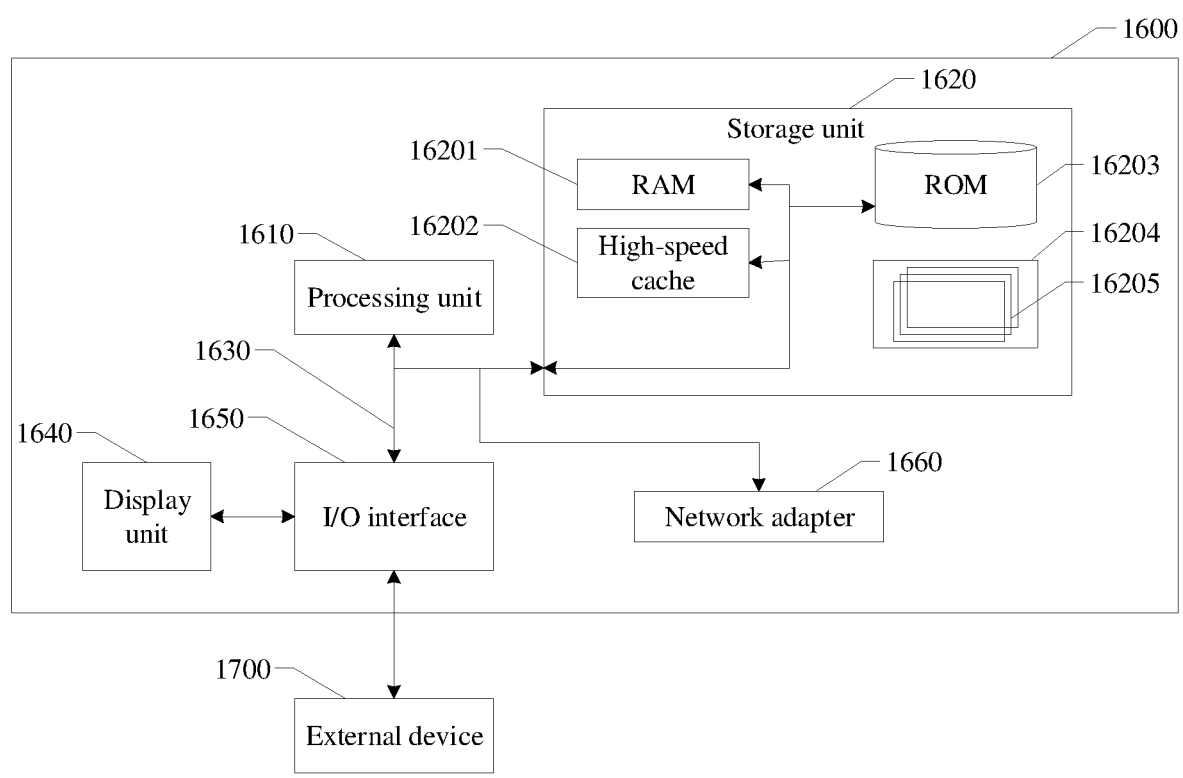
FIG. 16 schematically illustrates a block diagram of an electronic device according to an embodiment of the present invention.

As shown in FIG. 16, the electronic device 1600 is a general computing device. Components of the electronic device 1600 may include but not limited to at least one processing unit 1610, at least one storage unit 1620, a bus 1630 connecting different system components (e.g., the storage unit 1620 and the processing unit 1610), and a display unit 1640.

The storage unit 1620 stores a program code which may be executed by the processing unit 1610 to execute the steps of the method in the embodiments of the present invention in the For example, the processing unit 1610 may execute the steps S32 to S38 in FIG. 3.

The storage unit 1620 may include a readable medium in the form of a volatile storage unit, such as a RAM 16201 and/or a high-speed cache storage unit 16202, and may further include an ROM 16203.

The storage unit 1620 may further include a program/utility tool 16204 having at least a group of program modules 16205 that includes but not limited to an operation system, one or more application programs, other program modules and program data. Each or combinations of the embodiments of the present invention may include an implementation of a network environment.

The bus 1630 may include one or more types of bus, including a storage unit bus or storage unit controller, a peripheral bus, an accelerated graphics port, a processing unit, or a local bus of any one or more types of bus.

The electronic device 1600 may also be communicated with one or more external devices 1700 (e.g., a keyboard, a pointing device and a Bluetooth device), and may further be communicated with one or more devices capable of enabling a user to interact with the electronic device 1600, and/or any device (such as a router and a modem) capable of enabling the electronic device 1600 to communicate with one or more other computing devices. Such a communication may be performed via an Input/Output (I/O) interface 1650. Moreover, the electronic device 1600 may further be communicated with one or more networks (such as an LAN, a WAN and/or a public network like an Internet) via a network adapter 1660. As shown in the figure, the network adapter 1660 is communicated with other modules of the electronic device 1600 via the bus 1630. It should be understood that although not shown in the figure, other hardware and/or software modules, including but not limited to, a microcode, a device driver, a redundant processing unit, an external magnetic disk driven array, a RAID system, a magnetic tape driver, a data backup storage system, and the like, may be used in combination with the electronic device 1600.

With the description in the above embodiments, it is easily understood by those skilled in the art that the embodiments described herein may be implemented via software, and may also be implemented in a manner of software plus necessary hardware. Therefore, the technical solutions according to the embodiments of the present invention may be embodied in the form of a software product. The software product may be stored on a nonvolatile storage medium (which may be a CD-ROM, a U disk, a mobile hard disk, etc.) or a network, and includes a plurality of instructions to enable a set of computing device (which may include a personal computer, a server, a terminal device, or a network device, etc.) to execute the method according to the embodiments of the present invention.

In addition, the above accompanying drawings are merely schematic illustrations of processes included in the method according to the embodiments of the present invention, and does not construe limitations to the present invention. It is understood that the processes illustrated in the accompanying drawings do not indicate or limit sequences of these processes. Additionally, it is also understood that these processes may be executed in multiple modules synchronously or asynchronously.

It is to be noted that a plurality of modules or units of a device for executing an operation are described in the detailed description, but such a division is not mandatory. According to the embodiments of the present invention, the characteristics and functions of the above two or more modules or units may be implemented in one module or unit. Or, the characteristics and functions of the above described one module or unit may further be divided and implemented via multiple modules or units.

Other embodiments of the present invention will be obvious to those skilled in the art according to the specification and implementation of the present invention disclosed herein. The present invention covers any variations, uses, or adaptations of the present invention following the principles thereof and including disclosed or undisclosed common knowledge or conventional techniques in the technical field of the present invention. The specification and embodiments are merely exemplary. The scope and principles of the present invention are defined by the claims.

It should be understood that the present invention is not limited to the structures described above and shown in the accompanying drawings. Various modifications and changes may be made without departing from the scope of the present invention. The scope of the present invention may be limited by the appended claims.

What is claimed is:

1. A signal skew measurement method for an integrated circuit (IC), comprising:
acquiring a first signal and a second signal output by the IC, and respectively performing under-sampling on the first signal and the second signal to obtain a first sampled signal and a second sampled signal;
respectively performing digital conversion on the first sampled signal and the second sampled signal based on a preset threshold voltage to obtain a first digital signal and a second digital signal;
respectively performing convolution on the first digital signal and the second digital signal using a preset pulse signal to obtain a first comparison signal and a second comparison signal; and
calculating a skew between the first comparison signal and the second comparison signal to obtain a reference skew, calculating a product of the reference skew and an effective sampling period, and assigning the product to the skew between the first signal and the second signal.

2. The method according to claim 1, further comprising:
before performing the under-sampling, respectively performing delay calibration on the first signal and the second signal.

3. The method according to claim 2, wherein the respectively performing delay calibration on the first signal and the second signal comprises:
respectively performing the delay calibration on the first signal and the second signal using a time domain reflectometry (TDR).

4. The method according to claim 1, wherein the respectively performing under-sampling on the first signal and the second signal comprises:
determining an under-sampling period according to a period of the first signal, a period of the second signal, and the effective sampling period; and
respectively performing the under-sampling on the first signal and the second signal based on the under-sampling period.

5. The method according to claim 1, wherein the respectively performing digital conversion on the first sampled signal and the second sampled signal based on the preset threshold voltage comprises:
respectively setting sections of the first sampled signal and the second sampled signal higher than the preset threshold voltage as 1, and respectively setting sections of the first sampled signal and the second sampled signal lower than the preset threshold voltage as 0; or
respectively setting sections of the first sampled signal and the second sampled signal higher than the preset threshold voltage as 0, and respectively setting sections of the first sampled signal and the second sampled signal lower than the preset threshold voltage as 1.

6. The method according to claim 1, wherein the calculating the skew between the first comparison signal and the second comparison signal to obtain the reference skew comprises:
determining a plurality of calculation sampling points of each of the first comparison signal and the second comparison signal; and
calculating an average of time intervals between the plurality of calculation sampling points of the first comparison signals and the plurality of calculation sampling points of the second comparison signal, and assigning the average of the time intervals to the reference skew.

7. The method according to claim 5, wherein the preset threshold voltage includes a half of an amplitude of the first sampled signal or the second sampled signal.

8. The method according to claim 1, wherein the preset pulse signal includes a pulse signal corresponding to a half-bit theoretical time width.

9. A non-transitory computer-readable storage medium storing computer programs executable by a processor, wherein, upon being executed by the processor, the computer programs cause the processor to perform the signal skew measurement method of claim 1.

10. An electronic device, comprising:
a processor; and
computer-readable storage medium storing computer programs executable by the processor, wherein, upon being executed by the processor, the computer programs cause the processor to perform the signal skew measurement method of claim 1.

11. A signal skew measurement apparatus, applicable to an integrated circuit (IC), the apparatus comprising:
- an under-sampling module, configured to acquire a first signal and a second signal output by the IC, and respectively perform under-sampling on the first signal and the second signal to obtain a first sampled signal and a second sampled signal;
- a digital conversion module, configured to respectively perform digital conversion on the first sampled signal and the second sampled signal based on a preset threshold voltage to obtain a first digital signal and a second digital signal;
- a convolution module, configured to respectively perform convolution on the first digital signal and the second digital signal using a preset pulse signal to obtain a first comparison signal and a second comparison signal; and
- a skew measurement module, configured to calculate a skew between the first comparison signal and the second comparison signal to obtain a reference skew, calculate a product of the reference skew and an effective sampling period, and assign the product to the skew between the first signal and the second signal.

12. The apparatus according to claim 11, further comprising:
- a delay calibration module, configured to perform delay calibration on the first signal and the second signal, respectively.

\* \* \* \* \*

UNITED STATES PATENT AND TRADEMARK OFFICE
CERTIFICATE OF CORRECTION

PATENT NO. : 11,112,456 B2
APPLICATION NO. : 17/168104
DATED : September 7, 2021
INVENTOR(S) : Weibao Ke Page 1 of 1

It is certified that error appears in the above-identified patent and that said Letters Patent is hereby corrected as shown below:

On the Title Page

Item (30) Foreign Application Priority Data, insert:
--Aug. 31, 2018 (CN) .................... 201811012654.0--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*